(12) United States Patent
Theel

(10) Patent No.: US 6,765,835 B1
(45) Date of Patent: Jul. 20, 2004

(54) STABILIZING AND REDUCING NOISE APPARATUS AND METHODS IN MRAM SENSING OPERATIONS

(76) Inventor: Wayne Theel, 12005 41$^{st}$ Ave. N., #310, Plymouth, MN (US) 55441

( * ) Notice: Subject to any disclaimer, the term of this patent is extended or adjusted under 35 U.S.C. 154(b) by 0 days.

(21) Appl. No.: 10/393,750

(22) Filed: Mar. 21, 2003

(51) Int. Cl.$^7$ ................................................ G11C 7/02
(52) U.S. Cl. ........................ 365/209; 365/158; 365/171
(58) Field of Search ................................ 365/206, 207, 365/208, 209, 158, 171, 173

(56) References Cited

U.S. PATENT DOCUMENTS

| | | | | |
|---|---|---|---|---|
| 5,349,302 A | * | 9/1994 | Cooper ........................ | 365/207 |
| 5,748,519 A | * | 5/1998 | Tehrani et al. ................ | 365/98 |
| 6,191,972 B1 | * | 2/2001 | Miura et al. ................ | 365/171 |
| 6,424,564 B2 | * | 7/2002 | Li et al. ..................... | 365/158 |

* cited by examiner

*Primary Examiner*—Son Mai
(74) *Attorney, Agent, or Firm*—Rider Bennett, LLP; Hans Sun; Emil Moffa

(57) ABSTRACT

MRAM noise stabilizing and reducing apparatus and methods for MRAM sensing operations injects noise generated by activation of a word line (80, 82, 84, 86) into a sense line (128) and a reference line (130). Sense strings (20, 22, 24, 26) addressed by the word line (80, 82, 84, 86) are alternately coupled to the sense line (128) and the reference line (130). Cross coupling reduces the noise injected on the sense lines (128, 130). Cross coupling also balances the noise created by activation of the word line (80, 82, 84, 86) between the sense line (128) and reference line (130). A sense string (20, 22, 24, 26) not addressed by the word line (80, 82, 84, 86) provides a reference signal. A differential amplifier (132) includes circuitry to compare and store a difference between the sense line (128) and the reference line (130). The stored value can be further compared to a second value obtained by reversing the current on the word line (80, 82, 84, 86).

20 Claims, 5 Drawing Sheets

STABILIZING AND REDUCING NOISE APPARATUS AND METHODS IN MRAM SENSING OPERATIONS

The present invention generally relates to methods and apparatus suitable for stabilizing and reducing the effect of noise in a sensing operation of magnetoresistive random access memory (MRAM). More particularly, the invention provides methods and apparatus for stabilizing and reducing the effect of noise in a sensing operation of MRAM caused by capacitive interconnects between elements changing states during MRAM operation.

BACKGROUND OF THE INVENTION

Typical MRAM structures have a nonmagnetic layer sandwiched between two ferromagnetic films. MRAM employs the magnetoresistive properties of this structure to store data. In each storage element, an MRAM employs two orthogonal lines, commonly termed a word line and a sense string, in order to detect the magnetization direction of these magnetic thin films. Each sense string includes a magnetic thin film that serves as a memory element, and each word line generally addresses multiple sense strings. Magnetic thin films set to have a parallel moment have a low resistance and are typically assigned the "one" state. Magnetic thin films set to have an anti-parallel moment have a high resistance and are typically assigned the "zero" state, but may also be assigned to the "one" state.

During a read operation, a word current passes through the word line generating a magnetic field, thereby changing the resistance of the magnetoresistive material in the sense string. A sense current passes through the sense string. A sense line receives the signal from the sense string. A differential amplifier compares the signal from the sense line to a reference line to determine whether a one resistance or a zero resistance is stored in the MRAM. A differential amplifier notes the change in voltage across the sense line to determine the resistive state of a storage element.

Because the change in the voltage across the sense line is relatively small, on the order of 2–12 mV, noise is a significant factor affecting both the speed and the accuracy of the read operation. One primary source of noise is due to capacitive coupling from the word line to the sense strings during the rapid voltage change of the word line. The noise levels resulting from the capacitive coupling may typically exceed signal levels by a factor of ten or more. Furthermore, capacitive coupling varies in magnitude from one sensing operation to the next.

To compensate for the noise factor, various strategies may be employed. The sensing operation may be adjusted to allow for integration of the sensing signal over a longer time period. These strategies, however, have the effect of reducing the performance and efficiency of MRAM. Longer sensing operations reduce the operational speed of MRAM. Other strategies, such as using the magnetic tunneling junction, may be employed to obtain a larger signal. These methods do not address the problem of injected noise. Each sense string along the active word line provides additional capacitive coupling, and activation of the word line injects noise into each sense string. Thus, as MRAM arrays increase in size, the noise from capacitive coupling increases proportionally.

Stabilizing and reducing the effect of noise due to the activation of the word line detected by the differential amplifier would provide more accurate resolution of the read operation and quicker resolution of the sensing signal, allowing for faster and more reliable operation of MRAM. Increasing the sensing signal, while reducing and stabilizing noise, would further improve resolution of the sensing signal.

Use of multiple memory spots in each bit can increase the sensing signal, thus improving the signal to noise ratio. A number of factors limit the signal that can be obtained using a single memory element. Space considerations limit the width and length of each individual memory element. One constraint on the length of a memory element is the width of the word line. The word line must carry a current that generates a magnetic field sufficient to address the entire bit. Taking into account manufacturing variation, the memory element must be short enough to allow for remaining within a consistent field supplied by the word line. Thus, having too great a length may result in an individual memory element having inconsistent switching characteristics. Furthermore, inconsistent switching characteristics result in loss of uniformity through a memory array. Multiple memory spots, connected in series would increase the strength of the sensing signal in proportion to the number of memory spots while maintaining consistent switching characteristics.

Use of multiple memory spots in each bit can also improve reliability of MRAM memory arrays. If manufacturing defects result in one memory element of a multiple memory element bit being unreliable, the remaining memory spots can enable the bit to remain functional. This redundancy improves yield and lowers cost of manufacturing MRAM chips. Likewise, if electromigration or other operational hazard causes a memory element of a multiple memory element bit to malfunction, the remaining memory spots provide for continued usability of the MRAM chip. This provides for improved reliability of the MRAM chip.

Thus, there is a need for methods and apparatus for stabilizing and reducing noise during a sensing operation of MRAM that do not suffer from the deficiencies of prior apparatus. These methods and apparatus should ensure accurate read operations without necessitating longer read operations.

There is a further need for methods and apparatus for stabilizing and reducing noise allowing for larger MRAM applications.

There is a further need for methods and apparatus for stabilizing and reducing noise allowing for faster MRAM operation.

There is a further need for methods and apparatus that provide a greater differential in the signal from the sense circuit.

There is a further need for methods and apparatus for increasing the magnitude of the sensing signal.

There is a further need for methods and apparatus that allow for greater memory capacity of an MRAM array.

SUMMARY OF THE INVENTION

The present invention solves these needs and other problems in the field of MRAM sensing apparatus and methods by providing, in most preferred aspects, apparatus and methods for stabilizing and reducing noise present during MRAM sensing operations. The apparatus couples sense strings intersecting a word line to both a sense line and a reference line. Coupling of a portion of the sense strings to the sense line and a portion of the sense strings to the reference line reduces the amount of noise injected into the sense line. The coupling also balances noise between the sense line and the reference line in order to stabilize and reduce noise detected by the sensing apparatus.

It is therefore an object of the present invention to provide novel methods and apparatus to stabilize noise during a sensing operation of MRAM.

It is another object of the present invention to provide such novel methods and apparatus to reduce noise during a read operation of MRAM.

It is a further object of the present invention to provide such novel methods and apparatus to increase the operational speed of an MRAM read operation.

It is a further object of the present invention to provide such novel methods and apparatus to increase the magnitude of the difference in the sensing signal.

It is a further object of the present invention to provide such methods and apparatus to allow for greater capacity of MRAM arrays.

These and further objects and advantages of the present invention will become clearer in light of the following detailed description of an illustrative embodiment of this invention described in connection with the drawings.

BRIEF DESCRIPTION OF THE DRAWINGS

The illustrative embodiment may best be described by reference to the accompanying drawings where.

Figure 1:
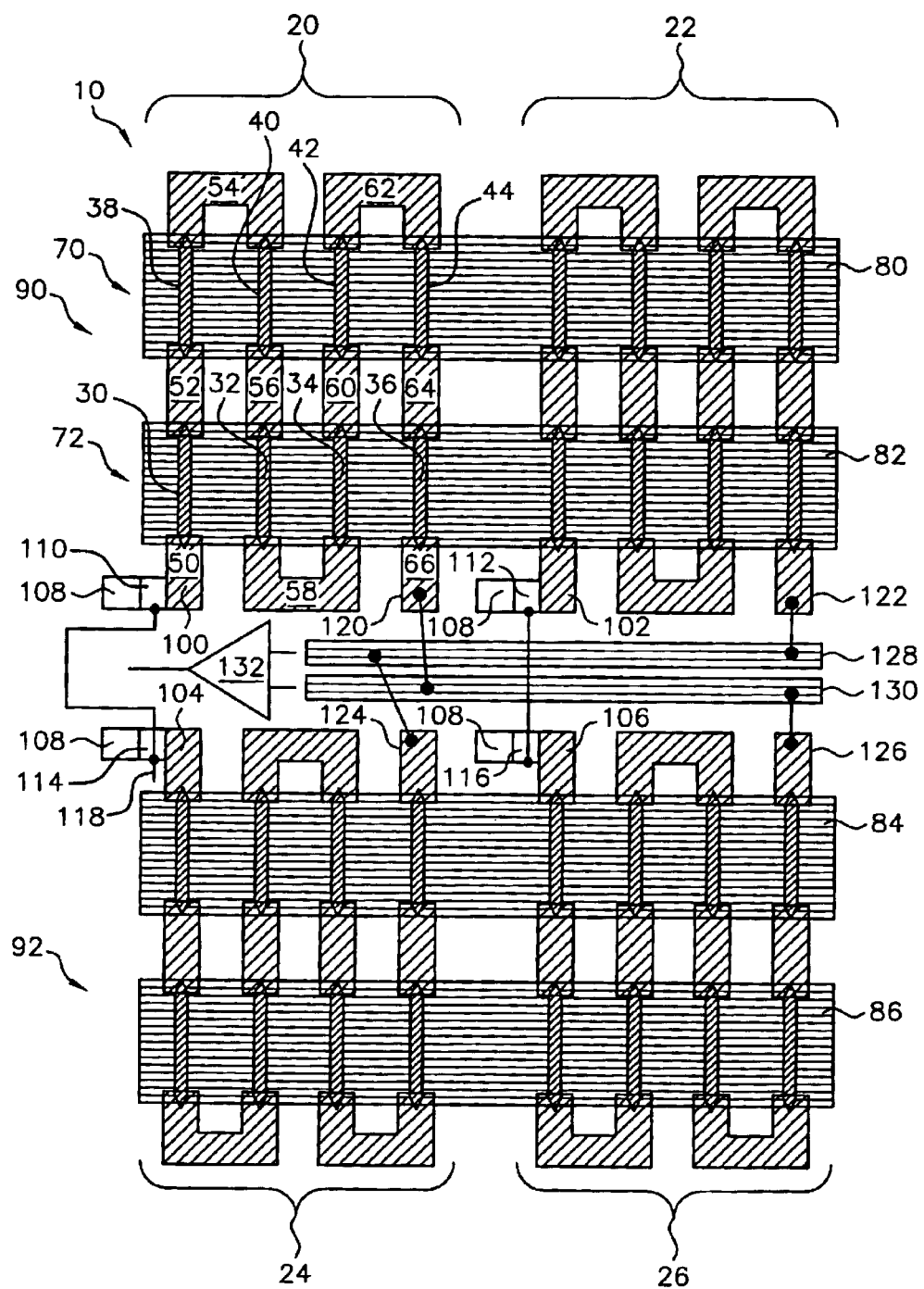
FIG. 1 shows a top view of an MRAM segment utilizing preferred methods according to the preferred teachings of the present invention, with portions of the MRAM structure removed to show details of the noise stabilization and reduction apparatus of the present invention.

All figures are drawn for ease of explanation of the basic teachings of the present invention only; the extensions of the figures with respect to number, position, relationship, and dimensions of the parts to form the preferred embodiment will be explained or will be within the skill of the art after the following description has been read and understood. Further, the exact dimensions and dimensional proportions to conform to specific voltages, amps, and similar requirements will likewise be within the skill of the art after the following description has been read and understood. Values provided are representative and are utilized to facilitate the description of the preferred embodiment.

Where used in the various figures of the drawings, the same numerals designate the same or similar parts. Furthermore, when the terms "upper," "lower," "side," "end" "bottom," "first," "second," "laterally," "longitudinally," "row," "column," "array," and similar terms are used herein, it should be understood that these terms have reference only to the structure shown in the drawings as it would appear to a person viewing the drawings and are utilized only to facilitate describing the illustrative embodiment.

DETAILED DESCRIPTION OF THE PREFERRED EMBODIMENT

A top view of an MRAM segment having a stabilizing and reducing noise apparatus in a sensing operation of MRAM according to the preferred teachings of the present invention is shown in FIG. 1 and is generally designated 10. Portions of the MRAM structure shown in FIG. 1 have been removed to show details of the noise stabilization and reduction apparatus of the present invention. Those skilled in the art will be aware that MRAM chips contain other structures and layers, such as a transistor layer that may be formed from polysilicon and a metal connect layer. These elements have been removed for the sake of clarity.

The MRAM segment includes a plurality of sense strings 20, 22, 24, 26. Each sense string 20, 22, 24, 26 includes one or more sub bits 30, 32, 34, 36, 38, 40, 42, 44 connected by strap layer segments 50, 52, 54, 56, 58, 60, 62, 64, 66. In the preferred embodiment of the present invention, the strap layer segments 50, 52, 54, 56, 58, 60, 62, 64, 66 connect the sub bits 30, 32, 34, 36, 38, 40, 42, 44 in series. In further aspects of the preferred embodiment, the structure of the sense strings 20, 22, 24, 26 have a serpentine conformation. In this conformation, groups of two sub bits 30, 32, 34, 36, 38, 40, 42, 44 form linear components. The strap layer segments 50, 52, 54, 56, 58, 60, 62, 64, 66 provide connection elements to join the sub bits 30, 32, 34, 36, 38, 40, 42, 44 into these linear components. Four of these linear components are located parallel to one another. The strap layer segments 50, 52, 54, 56, 58, 60, 62, 64, 66 also provide connection elements to join the linear components at alternating ends in order to connect the sub bits 30, 32, 34, 36, 38, 40, 42, 44 in series. In the preferred embodiment, the sense strings 20, 22, 24, 26 include eight sub bits 30, 32, 34, 36, 38, 40, 42, 44 connected in series. In an alternative embodiment, the sense strings 20, 22, 24, 26 may make up a single sub bit. Different numbers of sub bits and as well as different arrangements of the sub bits may be employed without departing from the spirit and scope of the invention.

The sub bits 30, 32, 34, 36, 38, 40, 42, 44 include the data storage element of the MRAM segment 10. These sub bits 30, 32, 34, 36, 38, 40, 42, 44 may also be termed "memory spots" or "memory elements". In the preferred embodiment, the sub bits or memory spots 30, 32, 34, 36, 38, 40, 42, 44 are grouped in fours, where the upper four memory spots 38, 40, 42, 44 make up an upper bit 70 and the lower four memory spots 30, 32, 34, 36 make up a lower bit 72.

The MRAM segment 10 employs a word line 80, 82, 84, 86 to address a selected bit 70, 72. In the preferred embodiment, the MRAM segment 10 uses two word lines 80, 82 to address the sense strings 20, 22, 24, 26, with an upper word line 80 addressing the memory spots 38, 40, 42, 44 of the upper bit 70 and a lower word line 82 addressing the memory spots 30, 32, 34, 36 of the lower bit 72. The upper word line 80 intersects each of the upper sub bits 38, 40, 42, 44 so that a sense current passing through the upper sub bits 38, 40, 42, 44 is orthogonal to a word current passing through the upper word line 80. Likewise, the lower word line 82 intersects each of the lower sub bits 30, 32, 34, 36 so that a sense current passing through the lower sub bits 30, 32, 34, 36 is orthogonal to a word current passing through the lower word line 82. Serial connection of the memory spots 30, 32, 34, 36, 38, 40, 42, 44 combined with activation of the word line 80, 82, 84, 86 corresponding to a selected bit 70, 72 allows each sub bit 30, 32, 34, 36, 38, 40, 42, 44 of the selected bit 70, 72 to contribute proportionally to the signal size.

As those skilled in the art will understand, other conformations of the sense strings 20, 22, 24, 26 may be employed without departing from the spirit or scope of the invention. In the four memory spot bit described above, each memory spot, or sub bit 30, 32, 34, 36, 38, 40, 42, 44 is designed to have length to width ratio providing for consistent switching characteristics. In one aspect of the invention, the number of memory spots 30, 32, 34, 36, 38, 40, 42, 44 per bit 70, 72 is designed to provide a selected signal size. In another aspect of the present invention, the number of memory spots 30, 32, 34, 36, 38, 40, 42, 44 per bit 70, 72 is designed to provide redundancy in the event of a defective bit. The defective bit may be the result of a manufacturing defect or operational failure. The MRAM may be advantageously designed to have functional bits with only three of four memory spots operational. In another embodiment, the MRAM may be advantageously designed to have functional bits with only two of three memory spots operational.

In other aspects of the present invention, the multiple memory spots 30, 32, 34, 36, 38, 40, 42, 44 of the bit 70, 72 may be addressed by a single word line 80, 82, 84, 86 to conserve power and allow a higher density of bits 70, 72; or alternatively, multiple word lines 80, 82, 84, 86 may be used to address the multiple memory spots 30, 32, 34, 36, 38, 40, 42, 44 of the bit 70, 72 when more memory spots 30, 32, 34, 36, 38, 40, 42, 44 are desired to obtain a stronger signal to noise ratio or a higher level of redundancy.

In a typical MRAM structure, an array 90 of sense strings includes multiple sense strings 20, 22 positioned adjacent to one another in a linear arrangement. These sense strings 20, 22 have the same general shape, so that the word line 80, 82 may address the sub bits 30, 32, 34, 36, 38, 40, 42, 44 of each sense string in the array 90. In one preferred embodiment, the array 90 includes thirty-three sense strings 20, 22 that may each be addressed by the upper word line 80 and the lower word line 82. As those skilled in the art will understand, the word line 80, 82 may address more or fewer sense strings 20, 22 without departing from the spirit or scope of the present invention. The sub bits 30, 32, 34, 36, 38, 40, 42, 44 of each sense string 20, 22 must be positioned so that a sense current passing through the sub bits 30, 32, 34, 36, 38, 40, 42, 44 is orthogonal to a word current passing through the word line 80, 82.

Each sense string 20, 24 has an input end 100, 102, 104, 106 connected to a voltage source 108 through a switch 110, 112, 114, 116. A transistor may serve as the switch 110, 112, 114, 116. A signal 118 triggers the switch 110, 112, 114, 116 of a selected sense string 20, 22, 24, 26 to allow a sense current to pass through the respective sense string 20, 22, 24, 26. Each sense string 20, 22, 24, 26 also has an output end 120, 122, 124, 126 connected to a sense line 128, 130. In the preferred form, the MRAM segment 10 includes two sense lines, an upper sense line 128 and a lower sense line 130, respectively. The MRAM segment 10 further includes two arrays 90, 92 of sense strings 20, 22, 24, 26, an upper array 90 positioned above the two sense lines 128, 130 and a lower array 92 positioned below the two sense lines 128, 130.

The MRAM segment 10 of the preferred form of the present invention provides for noise stabilization and reduction through the coupling of the respective output ends 120, 122, 124, 126 of the sense strings of the upper array 90 and the lower array 92. In one example embodiment, shown in FIG. 1, the output end 120, 122 of each of the sense strings 20, 22 of the upper array 90 is connected alternately to the upper sense line 128 and the lower sense line 130. Thus, in this example embodiment, sense string 20 is connected to the lower sense line 130, and sense string 22 is connected to the upper sense line 128. Likewise, the output end 120, 122, 124, 126 of each of the sense strings 24, 26 in the lower array 92 is connected alternately to the upper sense line 128 and the lower sense line 130. In this example embodiment, sense string 24 is connected to the upper sense line 128 and sense string 26 is connected to the lower sense line 130. This pattern of coupling the output ends 120, 122, 124, 126 of the sense strings 20, 22, 24, 26 continues for each of the sense strings 20, 22, 24, 26 in the arrays 90, 92. Those skilled in the art will understand that other patterns of coupling the output ends 120, 122, 124, 126 of the sense strings 20, 22, 24, 26 may be employed without departing from the spirit or scope of the present invention.

The upper sense line 128 and the lower sense line 130 provide the signal from the sense strings 20, 22, 24, 26 to a differential amplifier 132. The differential amplifier 132 detects the voltage difference in the signal provided by the upper sense line 128 and the lower sense line 130. Determination of the state of a selected bit makes use of the output of the differential amplifier 132.

Figure 2A:
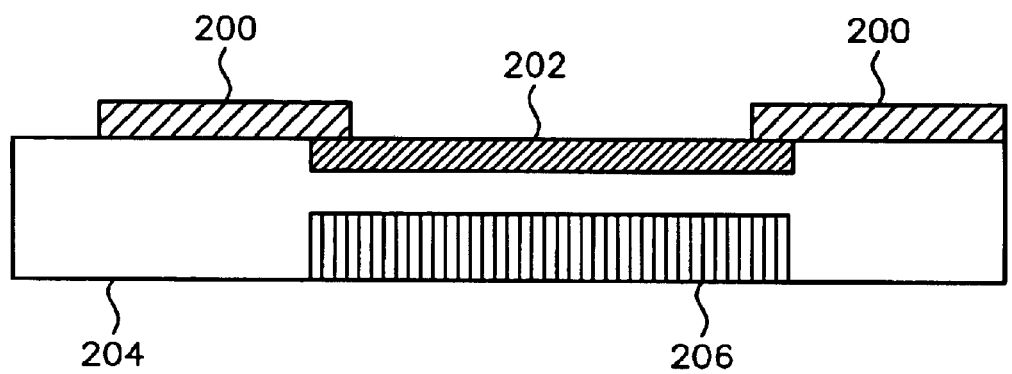
FIG. 2A shows an end view of a sense string and word line, with portions of the MRAM structure removed to show details of the structure of the sense string and word line.
Figure 2B:
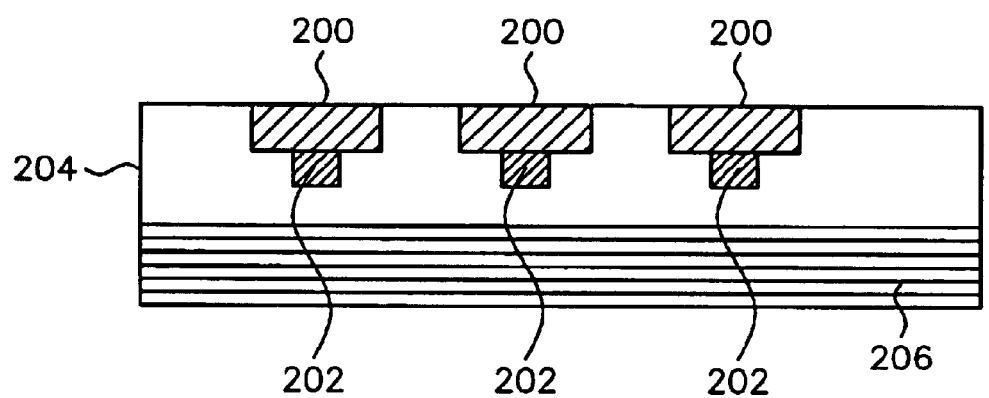
FIG. 2B shows a side view of a sense string and word line, with portions of the MRAM structure removed to show details of the structure of the sense string and word line.

FIGS. 2A and 2B show an end view and a side view, respectively, of a sense string 20, 22, 24, 26 and word line 80, 82, with portions of the MRAM structure removed to show details of the structure of sense string 20, 22, 24, 26 and word line 80, 82. The MRAM segment 10 has a strap layer 200 and a bit layer 202 embedded within a dielectric layer 204. The dielectric layer 204 also serves as an insulating layer 204. The sub bits 30, 32, 34, 36, 38, 40, 42, 44 are formed from sections of the bit layer 202 embedded within the dielectric layer 204. As shown in FIGS. 2A and 2B, the strap layer 200 overlies the bit layer 202. The strap layer 200 provides connection elements between the sub bits 30, 32, 34, 36, 38, 40, 42, 44. Overlap between the strap layer 200 and the sub bits 30, 32, 34, 36, 38, 40, 42, 44 provide contact between the strap layer 200 and the sub bits 30, 32, 34, 36, 38, 40, 42, 44. The word lines 206 are also embedded within the dielectric layer 204, and in the preferred form, the sense strings 20, 22, 24, 26 overlie the word lines 206. The conformation of the word lines 206 and the sense strings 20, 22, 24, 26 become a source of capacitive coupling. Furthermore, in order to present a substantially uniform field to the sub bits 30, 32, 34, 36, 38, 40, 42, 44, the length of the sub bits may be limited to the width of the word lines 206.

The present invention provides for a greater signal differential by employing multiple sub bits 30, 32, 34, 36, 38, 40, 42, 44 for each bit 70, 72. The memory spots for each bit are set to have the same magnetization state. Thus, in a high resistance state, or "0" state, the difference in resistance from a low resistance state, or "1" state, will be proportional to the number of memory spots 30, 32, 34, 36, 38, 40, 42, 44 in a bit 70, 72. In the preferred embodiment, sub bits 30, 32, 34, 36 and sub bits 38, 40, 42, 44 each make up one bit 70, 72, respectively. By connecting these memory spots 30, 32, 34, 36, 38, 40, 42, 44 in series, the example embodiment shown provides a signal having a voltage drop four times the magnitude that would be provided from a single memory spot More or fewer memory spots or sub bits 30, 32, 34, 36, 38, 40, 42, 44 may be employed for each bit 70, 72 to provide a signal having a desired magnitude.

The present invention also provides for a greater memory capacity by employing multiple groups of sub bits 30, 32, 34, 36, 38, 40, 42, 44 on each sense string 20, 22, 24, 26. Each group of sub bits 30, 32, 34, 36, 38, 40, 42, 44 on the sense string 20, 22, 24, 26 make up a separate bit 70, 72 and has a separate word line 80, 82, 84, 86 so that each group of sub bits 30, 32, 34, 36, 38, 40, 42, 44 may be addressed separately. In the preferred embodiment of the present invention, the upper word line 80 addresses upper sub bits 38, 40, 42, 44 and the lower word line 82 addresses lower sub bits 30, 32, 34, 36. A word current through either word line 80, 82 addresses the respective sub bits while not appreciably changing the resistance of the other sub bits. More or fewer groups of sub bits may be employed without departing from the scope of the present invention.

The MRAM queries the state of a bit using a sense current and a word current. By way of example, and not limitation, determination of the lower bit 72 begins by sending a signal that triggers the switches 110, 114 for the first sense string 20 and the reference sense string 24. This allows a sense current from voltage source 108 to flow through each respective sense string 20, 24. Concurrently, the MRAM applies a word current through the lower word line 82 of the upper array 90. All other sense strings 22, 26 and word lines 80, 84, 86 remain inactive. The magnetic field from the word current change the resistance of the sub bits 30, 32, 34, 36 to the sense current. By way of example, the current through the sense strings 20, 24 can be on the order of 3–5 milliamps and the current passing through the word line 82 can be on the order of 40–50 milliamps. These values are representative and may vary.

In the foregoing example, the lower sense line 130 receives the sense current from the sense string 20 and serves as a reference sense line. A second sense string, reference sense string 24, acts as a reference for sense string 20 and provides a reference signal unaffected by a word current An upper sense line 128 receives the sense current through sense string 24. In a similar fashion, when the MRAM segment 10 addresses a bit on sense string 24, sense string 20 may serve as a reference. The differential amplifier 132 samples the signals from the upper sense line 128 and the lower sense line 130. The differential amp 132 includes circuitry to employ an auto zero technique that locks in the difference of the signals from the upper sense line 128 and the lower sense line 130 as a base value. The current on the word line 82 is then reversed, causing the resistance of the memory spots 30, 32, 34, 36 to change because of the change of the magnetic field generated by the word line 82. The differential amplifier 132 then samples the signals from the upper sense line 128 and the lower sense line 130 again and provides the results to a comparator. The differential amplifier 132 further includes a comparator to determine the state of the lower bit 72.

In the foregoing example, the differential amplifier 132 receives a signal from the sense string 20 on the lower sense line 130 and a signal from reference sense string 24 on upper sense line 128. However, in addition to the signal from the sense current passing through the sense string 20, the current from the word line 82 has a capacitive interconnect with the sense string 20 and each of the sense strings 22 in the same array as the sense string 20. The capacitive interconnects generate a significant amount of noise in comparison to a bit component of the signal from the sense string, comprising up to fifty percent or of the bit component. Furthermore, the noise generated by the capacitive interconnects between the word line 82 and the sense strings 20, 22, 24, 26 vary from between each sensing event. Also, the noise is proportional to the number of sense strings 20, 22 in the array 90. Thus, as the array size increases, the amount of noise due to capacitive interconnects increases proportionally. These noise levels are a major impediment to development of fast and reliable MRAM applications. With increasing MRAM array sizes, these hindrances are exacerbated.

The MRAM segment 10 according to the preferred teachings of the present invention stabilizes and reduces noise generated by these capacitive interconnects. By coupling a first portion of each array 90 of sense strings to the upper sense line 128 and a second portion of each array 90 of sense strings 20, 22, 24, 26 to the lower sense line 130, the MRAM segment 10 reduces the amount of noise seen by each sense line 128, 130 proportional to the portion of sense strings 20, 22, 24, 26 coupled to the other sense line 128, 130. In the preferred embodiment, alternating sense strings 20, 22, 24, 26 in an array 90, 92 are coupled the upper sense line 128 and the lower sense line 130, respectively, reducing the amount of noise from capacitive coupling by approximately fifty percent. MRAM segment 10 according to the preferred teachings of the present invention also stabilizes the effect of noise through cross coupling of the sense strings 20, 22, 24, 26. The cross coupling of the sense strings 20, 22, 24, 26 balances the noise generated in the sense strings 20, 22, 24, 26 by activation of the word line 80, 82 between the upper sense line 128 and the lower sense line 130.

Figure 3:
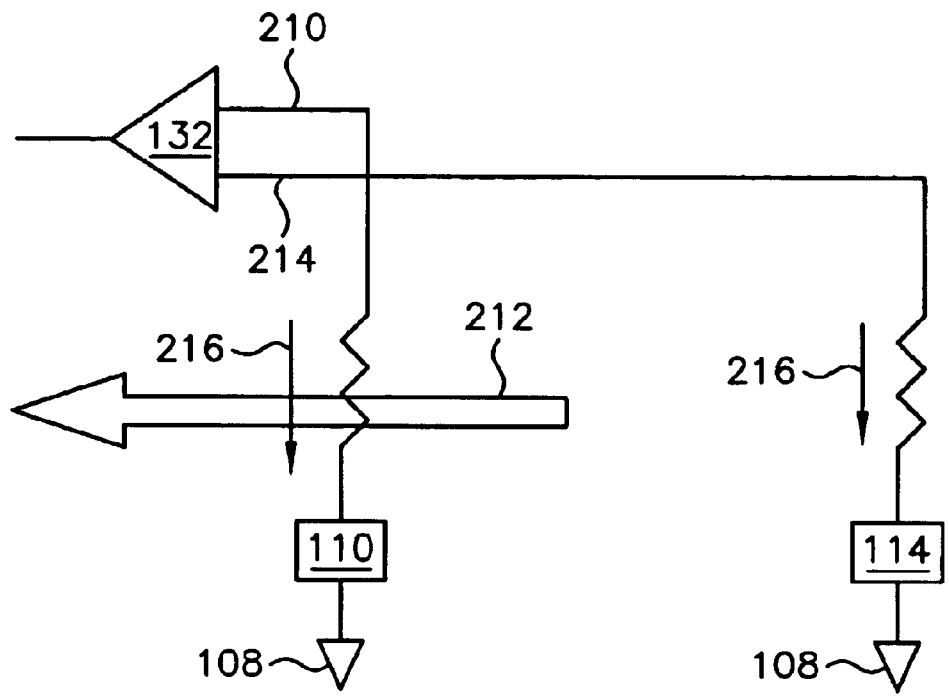
FIG. 3 shows a simplified circuit seen by the differential amplifier utilizing preferred methods according to the preferred teachings of the present invention with a sense string and a word line active.
Figure 3:
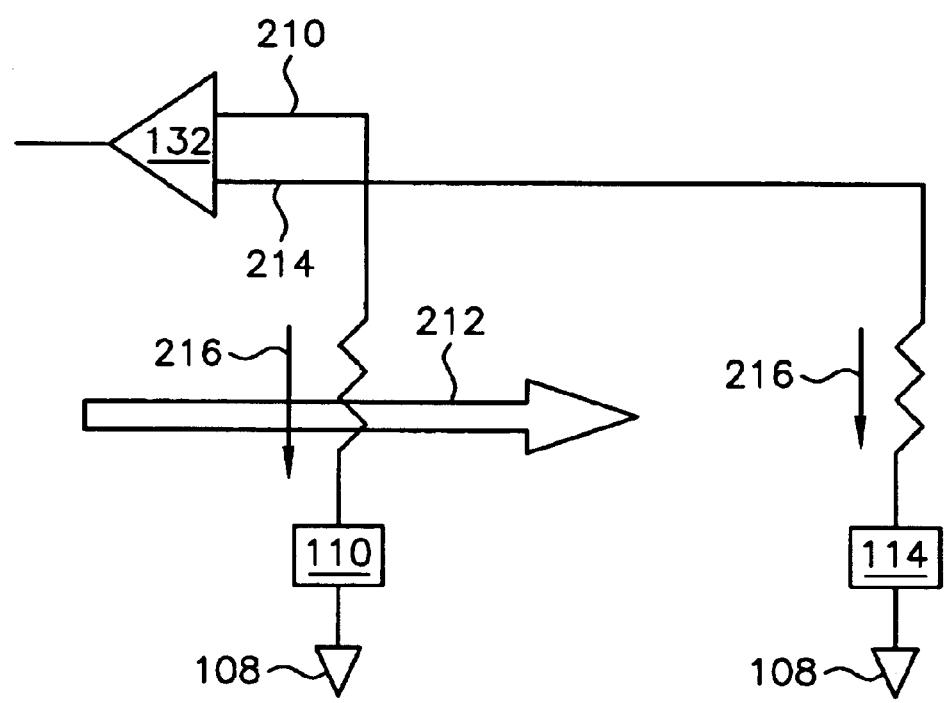

FIG. 3 shows a simplified circuit seen by differential amplifier 132 with the sense string 20 and the word line 82 active. At one input, the differential amplifier 132 receives the sense signal 210 from a sense string 20 having an active word line 82 with a word current 212. The other input receives a reference signal 214 from the reference sense string 24. Both the sense signal 210 and the reference signal 214 include a sense current 216 and a noise current injected by the capacitive coupling. The difference seen by the differential amplifier 132 is now largely due to the different voltage drop across the sense string 20 with the active word line 82 because of the different resistance to the sense current 216. A second signal can be obtained by reversing the word current 212.

Figure 4A:
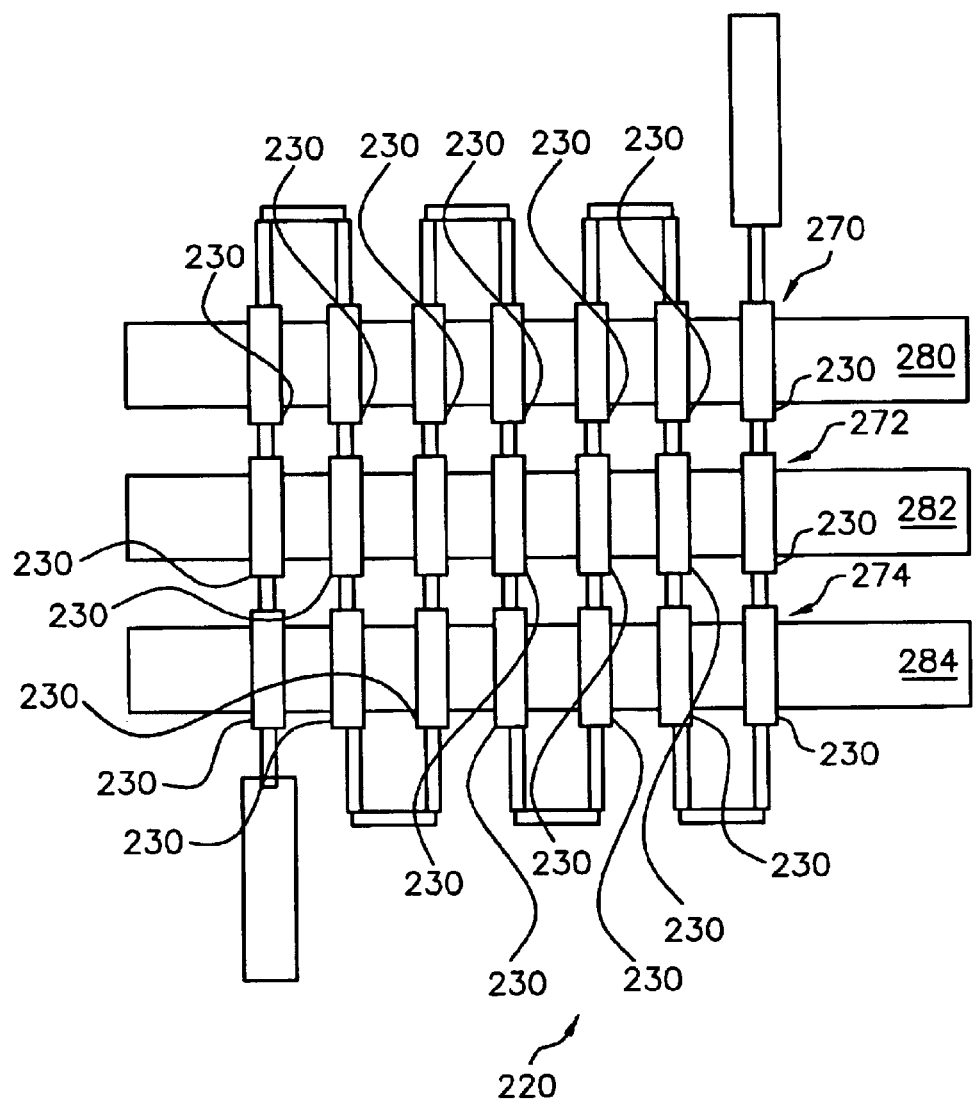
FIG. 4A shows another embodiment of an MRAM sense line utilizing preferred methods according to the preferred teachings of the present invention addressed by three word lines and having seven memory spots per bit.

FIG. 4A shows another embodiment of an MRAM sense string 220 utilizing preferred methods according to the preferred teachings of the present invention addressed by three word lines 280, 282, 284 and having seven memory spots 230 per bit 270, 272, 274. In this example embodiment, the upper word line 280 addresses the upper memory spots 230, the middle word line 282 addresses the middle memory spots 230, and the lower word line 284 addresses the lower memory spots 230.

Figure 4B:
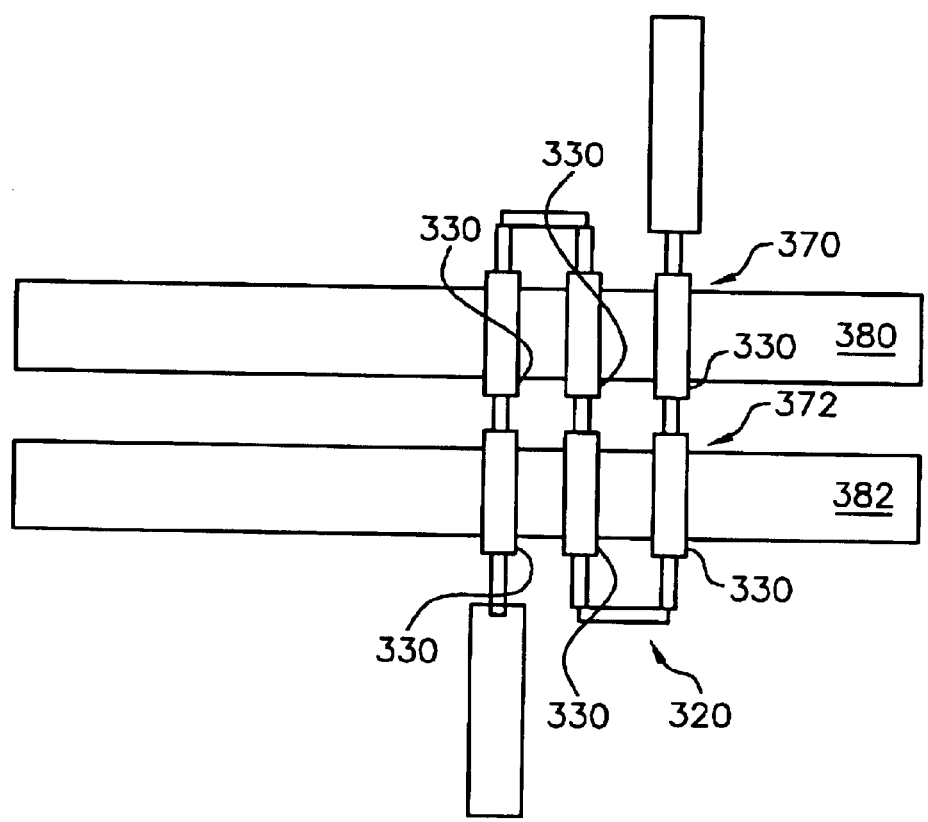
FIG. 4B shows another embodiment of an MRAM sense line utilizing preferred methods according to the preferred teachings of the present invention addressed by two word lines and having three memory spots per bit.

FIG. 4B shows another embodiment of an MRAM sense string 320 utilizing preferred methods according to the preferred teachings of the present invention addressed by two word lines 380, 382 and having three memory spots 330 per bit 370, 372. In this example embodiment, the sense string 320 includes two bits 370, 372 having three memory spots 330, where an upper bit 370 includes the upper memory spots 330, and a lower bit 372 includes the lower memory spots 330.

As these illustrative examples demonstrate, the number of memory spots comprising a single bit may be adjusted according to desired performance characteristics. For example, in the MRAM sense string 320 of FIG. 4B, each bit includes three memory spots 330. The memory state of either the upper bit 370 or the lower bit 372 may read if only two out of three memory spots 330 are functional, providing for added reliability. In another alternate embodiment, the memory spots 330 addressed by both one word lines 380, 382 may make up a single bit 370. This provides for a higher number of memory spots per bit, thereby increasing the signal to noise ratio. As those skilled in the art will recognize, more or fewer memory spots may be employed without departing from the scope or spirit of the invention.

As the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. MRAM having stabilized and reduced noise during a sensing operation comprising, in combination:

a first array of sense strings, with each of the sense strings in the first array of sense strings having an input end, an output end, and at least one bit, with the input end connected to receive a sense current, with the first array of sense strings separated into a first group of sense strings and a second group of sense strings;

at least one word line located to address the at least one bit of each of the sense strings in the first array of sense strings and connected to receive a word current;

a first sense line connected to the output ends of the sense strings in the first group of sense strings; and a second sense line connected to the output ends of the sense strings in the second group of sense strings.

2. The MRAM of claim 1 further comprising, in combination:

a reference array of sense strings, with each of the sense strings in the reference array of sense strings having an input end, an output end, and at least one bit, with each sense string in the reference array of sense strings having a corresponding sense string in the first array of sense strings and being connected to receive a sense current concurrently with the corresponding sense string in the first array of sense strings, with the reference array of sense strings separated into a third group of sense strings and a fourth group of sense strings, with each sense string in the third group of sense strings having a corresponding sense string in the first group of sense strings and each sense string in the fourth group having a corresponding sense string in the second group of sense strings; and at least one reference array word line located to address the at least one bit of each of the sense strings in the reference array of sense strings and connected to receive a word current, with the first sense line connected to the output end of the sense strings in the fourth group of sense strings and the second sense line connected to the output end of the sense strings in the third group of sense strings.

3. The MRAM of claim 1 further comprising, in combination:

a differential amplifier connected to receive a first signal from the first sense line and connected to receive a second signal from the second sense line, with the differential amplifier comprising circuitry implementing an auto zero technique to lock a difference between the first signal and the second signal as a base value.

4. The MRAM of claim 1 with the at least one bit of each of the sense strings of the first array of sense strings comprising an upper bit and a lower bit, and with the at least one word line comprising an upper word line located to address the upper bit of each of the sense strings of the first array of sense strings and a lower word line located to address the lower bit of each of the sense strings of the first array of sense strings.

5. The MRAM of claim 1 with the at least one bit comprising a plurality of sub bits, with the plurality of sub bits connected in series.

6. The MRAM of claim 1 with each of the sense strings of the first array of sense strings having a serpentine conformation.

7. The MRAM of claim 1 with adjacent sense strings in the first array of sense strings separated into the first group of sense strings and the second group of sense strings.

8. The MRAM of claim 1 further comprising, in combination:

a switch that sends the sense current through one of the sense strings of the first array of sense strings.

9. Method for stabilizing and reducing noise during a sensing operation of MRAM comprising:

selecting a bit for the sensing operation;

applying a word current through a word line that addresses the bit;

applying a sense current through a first sense string containing the bit;

coupling a first sense line to receive a first signal from the first sense string, with the first signal comprising the sense current through the sense string and noise from capacitive coupling with the word line; and coupling a second sense line to receive a second signal from a second sense string, with the second sense string having another bit addressed by the word line, and the second signal comprising the noise from capacitive coupling with the word line.

10. The method for stabilizing and reducing noise during a sensing operation of MRAM of claim 9 further comprising:

applying a sense current through a reference sense string contemporaneously with the first sense string; and coupling the second sense line to receive a reference signal from the reference sense string so that the second signal further comprises the reference signal.

11. The method for stabilizing and reducing noise during a sensing operation of MRAM of claim 9 further comprising:

processing the first signal and the second signal to provide a difference value;

locking the difference value as a base value;

reversing the current through the word line while maintaining the sense current to obtain a third signal from the first sense line and a fourth signal from the second sense line;

processing the third signal and the fourth signal to provide a second difference value; and comparing the second difference value to the base value to determine a state of the bit.

12. The method for stabilizing and reducing noise during a sensing operation of MRAM of claim 9 with applying the sense current through the first sense string further comprising applying the sense current through the first sense string including a plurality of bits.

13. The method for stabilizing and reducing noise during a sensing operation of MRAM of claim 9 with selecting the bit comprising selecting the bit including a plurality of sub bits.

14. The method for stabilizing and reducing noise during a sensing operation of MRAM of claim 9 with coupling the first sense line and coupling the second sense line comprising providing the first sense string and the second sense string in a first array of sense strings, and with the first array of sense strings divided into a first group coupled to the first sense line and a second group coupled to the second sense line, with adjacent sense strings in the first array of sense strings separated into the first group of sense strings and the second group of sense strings.

15. MRAM having reduced and stabilized noise during a sensing operation comprising, in combination:

a first array of sense strings, with each of the sense strings in the first array of sense strings having an input end, an output end, and a plurality of bits, with each input end connected to receive a sense current, with the first array of sense strings separated into a first group of sense strings and a second group of sense strings, and with each of the plurality of bits comprising a plurality of bits connected in series;

a reference array of sense strings, with each of the sense strings in the reference array of sense strings having an input end, an output end, and a plurality of bits, with each of the plurality of bits comprising a plurality of sub bits connected in series, with each one of the sense strings in the reference array having an associated sense string in the first array of sense strings and having the input end connected to receive the sense current with the associated sense string, with the reference array of sense strings separated into a third group of sense strings and a fourth group of sense strings, with each sense string in the third group of sense strings having a corresponding sense string in the first group of sense strings and each sense string in the fourth group having an associated sense string in the second group of sense strings;

a plurality of word lines, with one of the plurality of word lines located to address each sub bit of one of the plurality of bits of each sense string in the first array of sense strings and each sub bit of one of the plurality of bits of each sense string in the reference array of sense strings, with each of the plurality of word lines connected to receive a word current;

a first sense line connected to the output ends of the sense strings of the first group of sense strings and the fourth group of sense strings;

a second sense line connected to the output ends of the sense strings of the second group of sense strings and the third group of sense strings; and a differential amplifier connected to receive a first signal from the first sense line and connected to receive a second signal from the second sense line, with the differential amplifier comprising circuitry implementing an auto zero technique to lock a difference between the first signal and the second signal as a base value.

16. The MRAM of claim 15 with the plurality of bits of each sense string in the first array of sense strings and the plurality of bits of each sense string in the reference array of sense strings further comprising an upper bit and a lower bit.

17. Method for stabilizing and reducing noise during a sensing operation of MRAM comprising:

selecting a bit for the sensing operation;

applying a word current through a word line that addresses the bit;

applying a sense current through a first sense string containing the bit and a reference sense string;

coupling a first sense line to receive a first signal from the first sense string, with the first signal comprising the sense current through the sense string and noise from capacitive coupling with the word line;

coupling a second sense line to receive a second signal from a second sense string, with the second sense string having same bit addressed by the word line, and the second signal comprising the sense current through the reference sense string and the noise from capacitive coupling with the word line;

processing the first signal and the second signal to provide a first difference value;

reversing the current through the word line while maintaining the sense current to obtain a third signal from the first sense line and a fourth signal from the second sense line;

processing the third signal and the fourth signal to provide a second difference value; and comparing second difference value to the first difference value to determine a state of the bit.

18. The method for stabilizing and reducing noise during a sensing operation of MRAM of claim 17 with applying a sense current through a first sense string containing the bit and a reference sense string comprising applying a sense current through a first sense string containing a first plurality of bits and a reference sense string containing a second plurality of bits.

19. The method for stabilizing and reducing noise during a sensing operation of MRAM of claim 17 with selecting a bit for the sensing operation comprising selecting the bit including a plurality of sub bits.

20. The method for stabilizing and reducing noise during a sensing operation of MRAM of claim 17 further comprising:

injecting noise generated by applying the word current through the word line that addresses the bit into both the first sense line and the second sense line.

* * * * *